United States Patent
Stahr et al.

(10) Patent No.: US 10,306,750 B2
(45) Date of Patent: *May 28, 2019

(54) CIRCUIT BOARD AND METHOD FOR MANUFACTURING A CIRCUIT BOARD

(71) Applicant: AT & S Austria Technologie & Systemtechnik Aktiengesellschaft, Leoben (AT)

(72) Inventors: Hannes Stahr, St. Lorenzen im Mürztal (AT); Andreas Zluc, Leoben (AT); Timo Schwarz, St. Michael i.O. (AT); Gerald Weidinger, Leoben (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/534,172

(22) PCT Filed: Dec. 10, 2015

(86) PCT No.: PCT/EP2015/079206
§ 371 (c)(1),
(2) Date: Jun. 8, 2017

(87) PCT Pub. No.: WO2016/091995
PCT Pub. Date: Jun. 16, 2016

(65) Prior Publication Data
US 2017/0339783 A1    Nov. 23, 2017

(30) Foreign Application Priority Data
Dec. 11, 2014    (DE) .......................... 10 2014 118 462

(51) Int. Cl.
*H05K 1/02* (2006.01)
*H01L 23/538* (2006.01)
(Continued)

(52) U.S. Cl.
CPC ......... *H05K 1/0271* (2013.01); *H01L 21/481* (2013.01); *H01L 21/4857* (2013.01);
(Continued)

(58) Field of Classification Search
CPC ........... H01L 23/5389; H01L 23/49894; H01L 24/82; H05K 1/00; H05K 1/03;
(Continued)

(56) References Cited

U.S. PATENT DOCUMENTS 7,394,663 B2 *  7/2008  Yamashita ........ H01L 23/49894
                                                    257/E23.077
7,514,636 B2 *  4/2009  Sasaki ................. H01L 23/3107
                                                    174/252
(Continued)

FOREIGN PATENT DOCUMENTS

CN    1366444 A    8/2002
CN    1784121 A    6/2006
(Continued)

OTHER PUBLICATIONS

Yang, Jiao, Office Action in Application 201580075535.8, State Intellectual Property Office of P.R.of China, dated Dec. 24, 2018.

*Primary Examiner* — Tuan T Dinh
(74) *Attorney, Agent, or Firm* — Robert A. Blaha; Smith Tempel Blaha LLC

(57) ABSTRACT

A circuit board and a method of manufacturing a circuit board or two circuit boards are illustrated and described. The circuit board includes (a) a dielectric layer with a planar extension in parallel with respect to an xy-plane which is spanned by an x-axis and a y-axis perpendicular thereto and a layer thickness along a z-direction which is perpendicular with respect to the x-axis and to the y-axis; (b) a metallic layer which is attached to the dielectric layer in a planar manner; and (c) a component which is embedded in the
(Continued)

dielectric layer and/or in a dielectric core-layer of the circuit board. The dielectric layer includes a dielectric material which has (i) an elastic modulus E in a range between 1 and 20 GPa and (ii) a coefficient of thermal expansion in a range between 0 and 17 ppm/K along the x-axis and along the y-axis.

17 Claims, 5 Drawing Sheets

(51) Int. Cl.
    *H05K 1/03*     (2006.01)
    *H05K 1/18*     (2006.01)
    *H05K 3/46*     (2006.01)
    *H01L 21/48*     (2006.01)
    *H01L 23/14*     (2006.01)
    *H01L 23/00*     (2006.01)
    *H05K 1/11*     (2006.01)
    *H05K 3/00*     (2006.01)
    *H01L 21/56*     (2006.01)

(52) U.S. Cl.
    CPC ........ *H01L 23/145* (2013.01); *H01L 23/5383* (2013.01); *H01L 23/5387* (2013.01); *H01L 23/5389* (2013.01); *H01L 23/562* (2013.01); *H01L 24/19* (2013.01); *H01L 24/20* (2013.01); *H05K 1/0366* (2013.01); *H05K 1/0373* (2013.01); *H05K 1/0393* (2013.01); *H05K 1/115* (2013.01); *H05K 1/185* (2013.01); *H05K 1/189* (2013.01); *H05K 3/0017* (2013.01); *H05K 3/0097* (2013.01); *H05K 3/4602* (2013.01); *H01L 21/568* (2013.01); *H01L 23/5385* (2013.01); *H01L 2224/32145* (2013.01); *H01L 2224/73267* (2013.01); *H01L 2924/0002* (2013.01); *H01L 2924/18162* (2013.01); *H01L 2924/19105* (2013.01); *H01L 2924/3511* (2013.01); *H05K 1/0353* (2013.01); *H05K 2201/0129* (2013.01); *H05K 2201/0133* (2013.01); *H05K 2201/0187* (2013.01); *H05K 2201/0191* (2013.01); *H05K 2201/068* (2013.01); *H05K 2201/09136* (2013.01)

(58) Field of Classification Search
    CPC ...... H05K 1/18; H05K 1/0366; H05K 1/0393; H05K 3/00; H05K 3/45; H05K 3/4602; H05K 3/0097
    USPC ......... 361/760–766, 790–795; 174/258–268; 257/660–760
    See application file for complete search history.

(56) References Cited

U.S. PATENT DOCUMENTS

| | | | | |
|---|---|---|---|---|
| 7,935,893 | B2* | 5/2011 | Tanaka | H01L 24/82 174/258 |
| 8,024,858 | B2* | 9/2011 | Tanaka | H01L 24/82 29/832 |
| 8,222,723 | B2* | 7/2012 | Tuominen | H01L 23/5385 257/686 |
| 8,455,994 | B2* | 6/2013 | Iihola | H01L 23/5389 257/690 |
| 8,737,085 | B2* | 5/2014 | Sasaoka | H05K 1/188 174/250 |
| 2002/0140095 | A1 | 10/2002 | Funakura et al. | |
| 2005/0230848 | A1 | 10/2005 | Nakatani et al. | |
| 2006/0191711 | A1* | 8/2006 | Cho | H01L 23/5389 174/260 |
| 2009/0205202 | A1 | 8/2009 | Tanaka et al. | |
| 2010/0097770 | A1* | 4/2010 | Park | H01L 21/6835 361/748 |
| 2011/0259630 | A1 | 10/2011 | Park | |
| 2013/0008024 | A1 | 1/2013 | Park | |
| 2013/0277819 | A1 | 10/2013 | Yoshida | |
| 2013/0307113 | A1 | 11/2013 | Kunimoto | |

FOREIGN PATENT DOCUMENTS

| | | |
|---|---|---|
| EP | 1 650 798 A2 | 4/2006 |
| EP | 2 666 806 A1 | 11/2013 |
| WO | WO 2010085830 A1 | 8/2010 |

\* cited by examiner

CIRCUIT BOARD AND METHOD FOR MANUFACTURING A CIRCUIT BOARD

CROSS-REFERENCE TO RELATED APPLICATIONS

This application is a US national phase application of international patent application PCT/EP2015/079206 filed on Dec. 10, 2015, which claims the benefit of the filing date of German Patent Application No. 10 2014 118 462.9, filed on Dec. 11, 2014, the disclosures of which are hereby incorporated herein by reference in their entirety.

TECHNICAL FIELD

Embodiments of the present invention generally relate to the technical field of component carriers and circuit boards, respectively, on which and at which, respectively, electronic assemblies are built up. Embodiments of the present invention in particular relate to a circuit board with an embedded electronic component and a method of manufacturing such a circuit board.

TECHNOLOGICAL BACKGROUND

In modern electronics production, it is increasingly important to integrate and to embed, respectively, a special component, such as an electronic component, in the circuit board already during manufacturing the circuit board on which an electronic assembly with a plurality of electronic components is built up later. If the electronic component is an RFID component, a so-called traceability can be performed in a comparably easy manner, wherein a certain electronic assembly which is built up on a corresponding circuit board can be individually identified also during manufacturing a multiplicity of electronic assemblies in an industrial electronics production. This is important in particular at safety-relevant assemblies, such as a control unit for an airbag, such that a possibly defective electronic assembly can be unambiguously identified. Only in this way it can be ensured that, when a defect of such an assembly is present, assemblies of the same type which are built up at the same time with the same electronic components can be withdrawn from circulation, for example by way of a recall campaign.

However, an embedding of electronic components in a circuit board can lead to thermal tensions in the circuit board not only during manufacturing the circuit board, but also during the operation of an electronic assembly which is built up on the circuit board. This results from the fact that materials, such as the flame retardant material FR4 which is typically used for circuit boards and semiconductor materials such as silicon (Si) which is typically used for electronic components, have strongly different coefficients of thermal expansion. This naturally leads to thermal tensions. In the case of a multilayered circuit board, single layers can even warpage and/or detach from the other layers. It is easy to understand that such tensions lead to high mechanical stresses of an electronic assembly and reduce both the reliability and the resilience against failure of electronic assemblies.

There may be a need to provide a circuit board with an embedded electronic component and a method of manufacturing such a circuit board, such that electronic assemblies can be built up which are only exposed to low mechanical stresses also in the case of strong temperature changes.

SUMMARY

This need is met by the subject-matters of the independent claims. Advantageous embodiments of the present invention are described in the dependent claims.

According to a first aspect of the invention a circuit board is described which comprises (a) a dielectric layer which comprises a planar extension in parallel with respect to an xy-plane which is spanned by an x-axis and a y-axis perpendicular thereto and comprises a layer thickness along a z-axis which is perpendicular with respect to the x-axis and to the y-axis; (b) a metallic layer which is attached to the dielectric layer in a planar manner; and (c) a component which is embedded in the dielectric layer and/or in a dielectric core-layer of the circuit board. According to embodiments of the invention, the dielectric layer comprises a dielectric material which has (i) an elastic modulus E in a range between 1 and 20 GPa and (ii) a coefficient of thermal expansion in a range between 0 and 17 ppm/K along the x-axis and along the y-axis.

Embodiments of the present invention is based on the knowledge that components can be embedded in a novel material, such that temperature changes generate no or only less mechanical stress. With respect to a circuit board, one component, two components or also more than two components may be embedded. The material which is referred to as dielectric material in this document forms the inventive dielectric layer. The dielectric material, compared to the known flame retardant material FR4, is relatively soft and compliable. Due to this property, only low thermally induced mechanical stresses occur, such that warpages of a layer of the described circuit board can be reliably avoided. Due to the low thermally induced internal mechanical stresses, also the (internal) terminals of the embedded electronic component are only exposed to a low thermal stress. Furthermore, also the surfaces of the embedded component which are in contact with the dielectric material are only little mechanically stressed by temperature changes, such that the component is embedded in the circuit board in a mechanically gentle manner.

The metallic layer may be attached to the dielectric layer immediately, i.e. directly, or mediately, i.e. indirectly, via one or more intermediate layers.

It should be noted that the above described effects which are surprising from a technical point of view have also been experimentally proven by the inventors, since the inventive circuit board showed an excellent mechanical stability in so-called reflow tests. In such reflow tests, the circuit board, starting from room temperature, is exposed to such high temperatures which typically occur in a reflow-oven and which are sufficient for melting a solder paste which is located between component-terminal contacts of assembled components and terminal pads on the surface of the circuit board and for soldering the respective components to the surface of the circuit board. Inventive circuit boards have withstood at least ten reflow-cycles without destruction, wherein a reflow-cycle contains a temperature change from room temperature to a certain reflow-temperature and back.

The inventive dielectric material comprises a coefficient of thermal expansion in a range between 0 and 17 ppm/K. In this context it should be noted that from a technical point of view it is not a problem to manufacture a material with a coefficient of thermal expansion of zero. Namely, it is generally known that materials, in particular plastic materials, with a negative coefficient of thermal expansion exist. Thus, in order to manufacture a material with a coefficient of thermal expansion of zero, it is only required to mix a material with a negative coefficient of thermal expansion and a material with a positive coefficient of thermal expansion in a suitable manner, such that the positive and the negative expansion at least approximately compensate each other. Subsequently, the term coefficient of thermal expansion is also referred to as CTE.

With respect to the range of values of the elastic modulus E from 1 GPa to 20 GPa, the inventors have arrived at the knowledge that the lower limit of 1 GPa results from the fact that, for a process reliable processing and in particular for a procedure of pressing or pressing together the different layers of the circuit board, the dielectric material must not be too soft. When exceeding the upper limit of 20 GPa, no sufficient flowing behavior results for such a procedure of pressing.

It should be noted that the values for the elastic modulus E which are mentioned in this document relate to a temperature of 25° C.

As already mentioned above, using the inventive dielectric material leads to such a stress-free embedding of the component, that no or almost no warpages of at least one layer of the circuit board occurs. In particular, it has turned out that after the procedure of embedding the component in at least one of the both dielectric layers, possible warpages are less than 1%, such that the circuit board which is provided with the embedded component can be further processed in a problem-free manner. In this context, a further processing may in particular consist in assembling the inventive circuit board with further (electronic) components and/or soldering the inventive circuit board in a reflow oven. Furthermore, in this context a warpage of less than 1% means that a height of the warpage of the concerning layer (along the z-direction) in relation to a length of the concerning layer (in an xy-plane which is perpendicular with respect to the z-direction) is smaller than 1%.

Due to the possibility to embed the component in at least one of the both dielectric layers in a low-stressed manner, the inventive circuit board can also be equipped with comparably large components which have an area of 10 mm×10 mm, for example. In addition, the low thermally induced mechanical stresses also lead to a reduction of the mechanical stress on electric connections to and/or from the component when the inventive circuit board in the course of a further electronics production is connected to other conventional circuit boards, for example to a multilayer circuit board.

The inventive circuit board can be used in an especially advantageous manner for so-called power modules which operate with and at, respectively, a high electrical power and at which naturally a high heat development occurs due to electrical losses which can never be avoided. In manufacturing of such power modules, typically multiple circuit boards which are assembled with high power components are connected to each other in a suitable manner, such that these are arranged within a relatively small assembly space and consequently a very strong heat development occurs, in particular in an interior of this assembly space. Consequently, for such applications, the inventive circuit board which comprises an especially high thermal stability is especially suitable.

It should be noted that the described ranges of values of the inventive dielectric material constitute a currently ideal combination of elastic modulus and CTE. Namely, on the one hand, the thermal expansion is so small that only very low thermal tensions can occur, and on the other hand, the stiffness of the dielectric material is (a) so low that possibly present small thermal expansions can be compensated, and (b) so high that the dielectric material can be further processed in a conventional manner.

According to an embodiment of the invention the circuit board which is described here with an embedded component, is formed with a material which is described in EP 2 666 806 A1. This material is made of a fiber substrate and a layer of a resin composition which is curable under heat. This layer contains a modified siloxane compound or a compound with a basic structure made of a modified siloxane compound.

The described metallic layer in particular may be a copper layer which results from a copper foil. In manufacturing the described circuit board made of a layer composite which is consisting of at least the embedded component, the dielectric layer and the described metal layer, in the most simple case the copper foil can be lied over the other components of the circuit board and can be pressed together with these to a composite later. Of course, for the described circuit board, also layer build ups are possible which comprise more than one metallic layer and/or more than one dielectric layer.

In this document, the term "embedded" may denote that a component is surrounded from multiple sides by the concerning material and the concerning layer, respectively. The concerning side of the component may be entirely or only partially covered by the concerning material and the concerning layer, respectively. An embedded state of the component, in the case of a cuboid-shaped geometry of the component (i.e. a component with 6 side surfaces in total) may be present in particular (a) when the lower side surface and the four lateral surfaces are covered by the embedding material, (b) when only the four side surfaces are covered by the embedding material, (c) when the lower side surface is entirely covered and the four side surfaces are only partially covered by the embedding material, or (d) when only the four side surfaces are only partially covered by the embedding material.

The component may be an electronic component which in turn may be any arbitrary active or passive electronic component. In this context, the electronic component may be a further circuit board, a module (a circuit board which is entirely or partially assembled with components), a battery and/or a MEMS structure. However, the component may also be a "non-electronic" component, such as a cooling element, which in particular consists of a metallic material.

According to an embodiment of the invention the dielectric material comprises a creeping behavior which is determined by at least one of the following properties: (a) a plastic deformability in a range between 0.01% and 10%, in particular in a range between 0.1% and 5%, and further in particular in a range between 0.2% and 2%, and/or (b) a viscoelastic deformability in a range between 0% and 10%, in particular in a range between 0% and 5%, and further in particular in a range between 0% and 3%.

In this document, the term "deformability" may in particular describe the capability of the dielectric material to change its dimension (along a spatial direction) without a destruction of the inner structure (for example by forming hollows). The mentioned parameter values therefore relate to a change in length (in particular under tensile stress) of a stripe of material. It is assumed that during such a length change, the volume of the concerned stripe of material remains at least approximately the same. Descriptively speaking, when the stripe of material is expanded along its longitudinal direction, the stripe of material (perpendicular with respect to its longitudinal direction) becomes thinner.

It should be noted that the parameter values for the plastic deformability and the viscoelastic deformability which are specified here relate to room temperature (20° C.).

It should further be noted that the creeping property of the described dielectric material is at least approximately isotropic. This means that the creeping behavior of the dielectric layer is at least approximately the same in all spatial directions.

The described creeping property and the creeping behavior, respectively, of the dielectric material has the advantage that in manufacturing the circuit board and in particular during pressing the different circuit board-layers, the dielectric material extends into hollows and remains there. These hollows may be given intentionally or unintentionally. In particular, such hollows may be provided deliberately in the region of the component or adjacent to the component, in order to thereby achieve a secure and gentle embedding of the component.

The above described ranges of values for the elastic modulus and the CTE in connection with the here described creeping property constitute an ideal combination for a secure and gentle embedding of the component. The here described creeping property namely has the effect that during curing the material, the material still comprises a certain slidability for a certain time. Thus, a certain relaxation time results during which the material remains elastically deformable, but in particular additionally plastically deformable. Within this relaxation time and creeping time, the procedure of pressing the different layers of the inventive circuit board should be at least approximately completely performed.

According to a further embodiment of the invention the dielectric material is a mix or a copolymer consisting of at least one first material with a first elastic modulus E and a first coefficient of thermal expansion and a second material with a second elastic modulus E and a second coefficient of thermal expansion. The first elastic modulus is larger than the second elastic modulus and the first coefficient of thermal expansion is smaller than the second coefficient of thermal expansion.

Descriptively speaking, the first material compared to the second material is harder and comprises a smaller CTE. By the selection of a suitable mixing ratio or copolymerization ratio between the first material and the second material, the previously described dielectric material which comprises the desired elastic modulus E and the desired CTE can be manufactured in a relatively easy manner.

According to a further embodiment of the invention the first material comprises a first glass transition temperature and the second material comprises a second glass transition temperature. The first glass transition temperature is higher than the second glass transition temperature.

By the selection of two materials with different glass transition temperature (Tg), by means of mixing or copolymerizing the both materials, the above described dielectric material which comprises the desired elastic modulus E and the desired CTE can be manufactured in an especially easy manner.

The first Tg may be in a range between 150° C. and 190° C., for example, and in particular in a range between 160° C. and 180° C. Preferably, the first Tg is at least approximately 170° C. The second Tg may be in a range between 0° C. and 70° C., for example, and in particular in a range between 10° C. and 30° C. Preferably, the second Tg is at least approximately at room temperature (20° C.).

According to a further embodiment of the invention the first material comprises a resin and a hard filler contained therein. The resin may be a phenol resin or an epoxy resin, such as a brominated bisphenol A epoxy resin, for example. The filler may be glass, quartz and/or aluminum hydroxide. With such a filler, a low value for the CTE of the first material can be adjusted in an especially easy manner. Preferably, the filler may comprise small $SiO_2$ spheres or particles which are encapsulated by the resin.

According to a further embodiment of the invention the second material comprises a thermally curable resin which is connected with a softening substance. By means of a suitable dosage of the softening substance, the desired hardness and softness, respectively, of the dielectric material may be adjusted in a simple and accurate manner.

The softening substance may be an aliphatic polyester or polyether, for example, wherein during polyaddition an elastic block copolymer is generated.

According to a further embodiment of the invention the value for the elastic modulus E is in a range between 2 and 7 GPa, and in particular in a range between 3 and 5 GPa. With an elastic modulus in these ranges, an especially good compromise between (a) an embedding of the component which is as tension-free as possible, and (b) a good processability of the dielectric layer can be achieved.

According to a further embodiment of the invention the coefficient of thermal expansion is in a range between 3 and 10 ppm/K, and in particular in a range between 5 and 8 ppm/K.

According to an embodiment which is currently considered as the best embodiment, the CTE of the dielectric material is at least approximately 6 ppm/K. Thus, the CTE of the dielectric material is approximately equal to the CTE of electronic components which consequently can be embedded in the circuit board in an especially tension-free manner. In this context it should be noted that the CTE of electronic components is substantially determined by the CTE of silicon which comprises a CTE of approximately 3 ppm/K.

According to a further embodiment of the invention the circuit board further comprises the dielectric core-layer which is attached to the metallic layer and/or to the dielectric layer in a planar manner. According to the here described embodiment the component is embedded in the dielectric core-layer and the dielectric layer is arranged above or below the dielectric core-layer and the embedded component.

Preferably, the component is exclusively embedded in the dielectric core-layer. In addition, the dielectric core-layer may be arranged between two dielectric layers. More preferably, the dielectric layer is located directly on the dielectric core-layer and the component, respectively. Descriptively speaking, the dielectric layer constitutes a cover structure for the component. Thereby, the dielectric layer which to a high degree is responsible for the absence of tension in the described circuit board is located directly at the component whose embedding is consequently at least approximately perfectly tension-free.

In this context, layer build-ups currently seem to be interesting which result by a combination of a relatively stiff dielectric core-layer which comprises a low shrinkage with the dielectric layer which is described in this document. Here, besides the low-stressed embedding of the component, namely additionally a good dimensional stability can be ensured which is important in particular for a further build-up to a high quality multilayer-circuit board.

The here described stiffness of the dielectric core-layer may for example be achieved by using a curable material for the dielectric core-layer, which is cured in the course of manufacturing the described circuit board.

According to a further embodiment of the invention the component is adhered in the dielectric core-layer. This enables an especially stable embedding of the component in the dielectric core-layer in an advantageous manner.

In this embodiment, the dielectric core-layer preferably is a stiff core which is equipped with a dielectric layer on both planar sides. Attaching the both dielectric layers may be performed by means of laminating in a known manner in order to generate a stable layer composite with the embedded component.

According to a further embodiment of the invention the dielectric core-layer comprises a dielectric core-material which has a coefficient of thermal expansion from 0 to 11 ppm/K, in particular from 2 to 10 ppm/K, and further preferably from 3 to 9 ppm/K along the x-axis and along the y-axis. This has the advantage that the core of the circuit board consists of a material which comprises a CTE in the order of magnitude of the CTE of the embedded component and Si, respectively. The core-material, in particular when it is a cured core-material, may have a high elastic modulus E in order to be able to absorb forces which are generated during the procedure of laminating and thus to not transmit the forces to the embedded component. In a gap between the embedded component and the core-material, the above described dielectric material with its comparably low elastic modulus E may be arranged. Due to the low elastic modulus E, it is capable to compensate tensions in an advantageous manner.

In this context it should be noted that by means of a thermal adaption of the coefficients of thermal expansion of the dielectric core-material and the component, the following advantageous effects can be achieved:
(A) the operational reliability of an electronic circuit which is built up on the circuit board, which optionally may contain the embedded component can be improved compared to known circuit board build-ups, in particular during fluctuating thermal conditions;
(B) Also in subsequent thermal processes, no or only negligible mechanical tensions are introduced in the layer composite of the described circuit board. Thereby, a composite with low warpage results. This applies even when a surface ratio of the embedded component(s) compared to the entire surface of the described circuit board is more than 30%.

According to a further embodiment of the invention the component is embedded in the dielectric layer.

If the described circuit board additionally comprises the above described core-layer, the component is located preferably exclusively in the dielectric layer.

It should be noted that using the above-described dielectric core-layer for the circuit board described in this document is optionally. Also when the dielectric core-layer confers a certain mechanical firmness to the circuit board, which is advantageously in many applications, the inventive circuit board may also be built up without dielectric core-layer, in particular in the case when it shall be a flexible circuit board.

According to a further embodiment of the invention the dielectric layer is a dielectric prepreg-layer and/or the dielectric material is a dielectric prepreg-material. This has the advantage that the described circuit board with respect to the manufacturing technique can be build up in an especially efficient manner.

In this document, the term "prepreg-layer" may denote a pre-manufactured dielectric layer-shaped substrate which is built up from "prepreg-material". In this context, prepreg is the English short form for "pre-impregnated fibers" which means "vorimpregnierte Fasern" in German. A prepreg is a semi-finished product consisting of long fibers or endless fibers and a pre-dried and pre-cured, respectively, but not yet polymerized thermosetting plastic matrix which is mainly used in lightweight construction. The contained fibers may be present as purely unidirectional layer, as tissue or as fabrics (Gelege).

According to a further embodiment of the invention the entire thickness of the layer composite is smaller than approximately 200 µm, in particular smaller than approximately 190 µm, and further in particular smaller than approximately 180µ. In embodiments which have been already realized by the inventors, the layer composite even has an entire thickness of only 170 micrometer and of 150 micrometer and is thus thinner than approximately 175 micrometers.

It should be noted that the achievable minimum thicknesses of the circuit boards are dependent on the height of the embedded component. In this context, the above mentioned thicknesses relate to an embedded component with a height of 150 µm.

It should further be noted that the thickness of the layer composite may be equal to the thickness of the entire circuit board. With the here described combination of dielectric material and asymmetric build-up, when an embedded component with a thickness of 150 µm is present, stable circuit boards and circuit board structures, respectively, can consequently be built up which are up to 20% thinner than conventional circuit boards with such an embedded component.

The circuit board may comprise a mechanical support structure on only one side, that is either above or below the embedded component. It should be noted that such a structure is only possible when using the dielectric layer which is described in this document, since only this comprises the elasticity and thermal expansion which is required for such a build-up.

According to a further embodiment of the invention the circuit board comprises an asymmetric build-up with respect to a plane of the embedded component along an axis. The plane is oriented in parallel with respect to the planar surface of the dielectric layer. In addition, the plane intersects the embedded component in the center and the axis is perpendicular with respect to this plane.

In this document, the term "build-up" in particular denotes a sequence of layers which respectively are characterized by a certain thickness and by a certain material. In the case of an asymmetric build-up, the layer sequence above the embedded component, with respect to the layer materials and/or with respect to the layer thicknesses, is different than the layer sequence below the embedded component.

An asymmetric build-up may in particular contribute to the fact that the circuit board can be realized in an especially flat and thin, respectively, layer structure. In particular, the described circuit board may comprise a mechanical support structure only on one side that is either above or below the embedded component. It should be noted that such a structure is only possible when using the dielectric layer which is described in this document, since only this comprises the elasticity and thermal expansion which is required for such a build-up.

According to a further aspect of the invention a method of manufacturing a circuit board and in particular of manufacturing a circuit board of the above mentioned type is described. The method comprises (a) providing a dielectric layer which comprises a planar extension in parallel with respect to an xy-plane which is spanned by an x-axis and a y-axis perpendicular thereto and comprises a layer thickness along a z-direction which is perpendicular with respect to the x-axis and to the y-axis; and (b) embedding a component in the dielectric layer and/or in a dielectric core-layer of the circuit board, wherein the dielectric core-layer is attached to the dielectric layer. According to embodiments of the invention, the dielectric layer comprises a dielectric material which has (i) an elastic modulus E in a range between 1 and 20 GPa and (ii) a coefficient of thermal expansion in a range between 0 and 17 ppm/K along the x-axis and along the y-axis.

Also the described method is based on the knowledge that by using a dielectric layer which is consisting of and comprises, respectively, the dielectric material with its inventive ranges of values for the elastic modulus E and the coefficient of thermal expansion, a circuit board structure can be provided which, also when strong temperature changes are present, remains free from mechanical tensions to a large extent. This on the one hand reduces the error-proneness under thermal stresses during the operation of an electronic circuit which is built up on the circuit board. On the other hand, also the manufacturing of the circuit board itself and the further processing thereof, for example the connection to another circuit board, can be facilitated.

The dielectric core-layer may be attached to the dielectric layer immediately, i.e. directly, or mediately, i.e. indirectly, via one or more intermediate layers.

According to an embodiment of the invention, the method further comprises forming a recess in the dielectric layer and/or in the dielectric core-layer. Furthermore, embedding the component comprises inserting the component in the recess.

According to an embodiment of the invention embedding the component further comprises inserting an adhesive material in the recess.

The adhesive material may be may be a glue with a low viscosity which has the property to establish a connection which is as tight as possible both (a) with the material of the component and (b) with the dielectric layer and/or with the dielectric core-layer. Thereby, an especially high mechanical stability of the embedding of the component can be achieved.

In dependency from the package of the electronic component, the adhesive should be configured such that it has a good connection to a semiconductor material, in particular silicon (if the electronic component is an unhoused chip and a bare die, respectively), or to a typical packaging material of a component (if the electronic component is a housed chip).

According to an embodiment of the invention the recess is larger than the component, such that after an inserting of the component in the recess a hollow remains. In the course of the further processing of the circuit board, the dielectric material can enter into this hollow, such that the embedded component is surrounded by the dielectric material from different sides. Thereby, an especially stress-free embedding of the component in the circuit board in an advantageous manner results.

According to a further embodiment of the invention the method further comprises (A) if the component is embedded in the dielectric layer, applying a further dielectric layer on the dielectric layer and the component, wherein the further dielectric layer has the same properties as the dielectric layer, and (B) if the component is embedded in the dielectric core-layer, applying the dielectric layer on the dielectric core-layer and the component.

Descriptively speaking, according to the here described embodiment, the applied further dielectric layer and the applied dielectric layer, respectively, constitutes a cover structure which serves for a good mechanical stability while the component furthermore is embedded in a stress-free manner. This in particular applies also during temperature fluctuations which may occur during the further manufacturing of an assembly on the described circuit board and/or during an operation of the assembly which is built up on the described circuit board.

According to a further embodiment of the invention the method further comprises forming a metallic layer at the dielectric layer.

The metallic layer in particular may be a copper layer which can be structured in a suitable manner later, in order to provide conductor traces for (with respect to the circuit board external) electronic components of an electronic assembly which is assembled on the circuit board. Furthermore, such conductor traces may also be used for contacting the embedded (with respect to the circuit board internal) component. For this purpose, also vias can be used in a known manner which may be formed for example by means of laser drilling in particular in the dielectric layer which is covering the component and which vias can be subsequently metallized in a known manner, in order to realize a contacting perpendicular with respect to the plane of the layers of the circuit board.

According to a further embodiment of the invention the method further comprises pressing all layers of the circuit board.

By means of a suitable pressing, from the previously comparably loose layer build-up of the circuit board, a mechanically stable layer composite can be generated in a simple manner. However, it should be noted that in particular in dependency from the entire thickness of the layer composite, the circuit board may still comprise a certain flexibility.

According to a further embodiment of the invention a method of manufacturing two processed circuit boards is described. The method comprises (a) building up a layer composite with a first asymmetric circuit board, a second asymmetric circuit board and a release layer which is arranged between the first circuit board and the second circuit board; (b) processing the entire layer composite; and (c) separating the layer composite at the release layer, such that a first processed circuit board and a second processed circuit board with respectively one asymmetric layer build-up are generated.

The described method is based on the knowledge that a symmetrically built up layer composite with all its advantages can be used during its manufacturing and processing, in order to manufacture two asymmetric circuit boards which comprise the above described advantages, in particular the especially small entire thickness, by means of a suitable separating at a release layer.

In the here described method, the two at least partially unprocessed circuit boards which are built up to the layer composite constitute a semi-finished product. The connection of these both semi-finished product which respectively comprise at least one of the above described dielectric layers is preferably performed at selected positions by means of pressing. The selected positions in particular may be given by points which are not required in the further process execution anymore and which are not influenced by the further process execution anymore, respectively.

After pressing, in an advantageous manner both semi-finished products can be treated simultaneously, wherein there is no need to waive the advantages of an asymmetric build-up. This treatment and processing, respectively, may contain all the necessary working steps in circuit board production. The working steps may, for example, contain a further building up of layers, a drilling of vias, a photo etching, etc. By releasing the processed first circuit board from the processed second circuit board at the release layer, two asymmetric circuit boards are obtained in a simple manner which have been manufactured in a single process run. Subsequently, at the both single processed asymmetric circuit boards, final finishing-processes such as depositing of gold layers, contour milling, etc. may be performed.

According to an embodiment of the invention the built up layer composite comprises a symmetry plane along the z-axis, which is oriented in parallel with respect to the xy-plane.

According to further embodiment of the invention the release layer comprises a printable adhesion reducing material which is transferred on at least a subregion of the first circuit board or on at least a subregion of the second circuit board by means of a printing method and in particular by means of a screen printing method. Such an adhesion reducing material which is also referred to as adhesion prevention material is described in WO 2010/085830 A1, for example, and is composed of an adhesion prevention additive, a binding agent, and a solvent. Such an adhesion prevention agent may, previously to laminating and pressing the concerning layer composite, respectively, be structured and printed on the desired surface of the concerning circuit board and allows, after laminating and separating the lateral boundary of the structured region, a separating of the both (parts of the) circuit boards in the structured region. Such an approach for separating can be performed distinctly easier and cheaper than for example another approach wherein, instead of the adhesion reducing material, a separating foil (e.g. a Teflon foil) is laid between the both circuit boards previously to the procedure of laminating and pressing, respectively.

It should be noted that embodiments of the invention are described with reference to different subject-matters of the invention. In particular, some embodiments of the invention are described with apparatus claims and other embodiments of the invention are described with method claims. When reading this application, it becomes immediately apparent to those skilled in the art that, unless explicitly otherwise specified, in addition to a combination of features which belong to a type of subject-matter of the invention, also an arbitrary combination of features is possible which belong to different types of subject-matters of the invention.

Further advantages and features of embodiments of the present invention can be taken from the following exemplary description of currently preferred embodiments. The single figures of the drawing of this application are to be considered as merely schematically and not as true to scale.

DETAILED DESCRIPTION OF EXEMPLARY EMBODIMENTS

Figure 1:
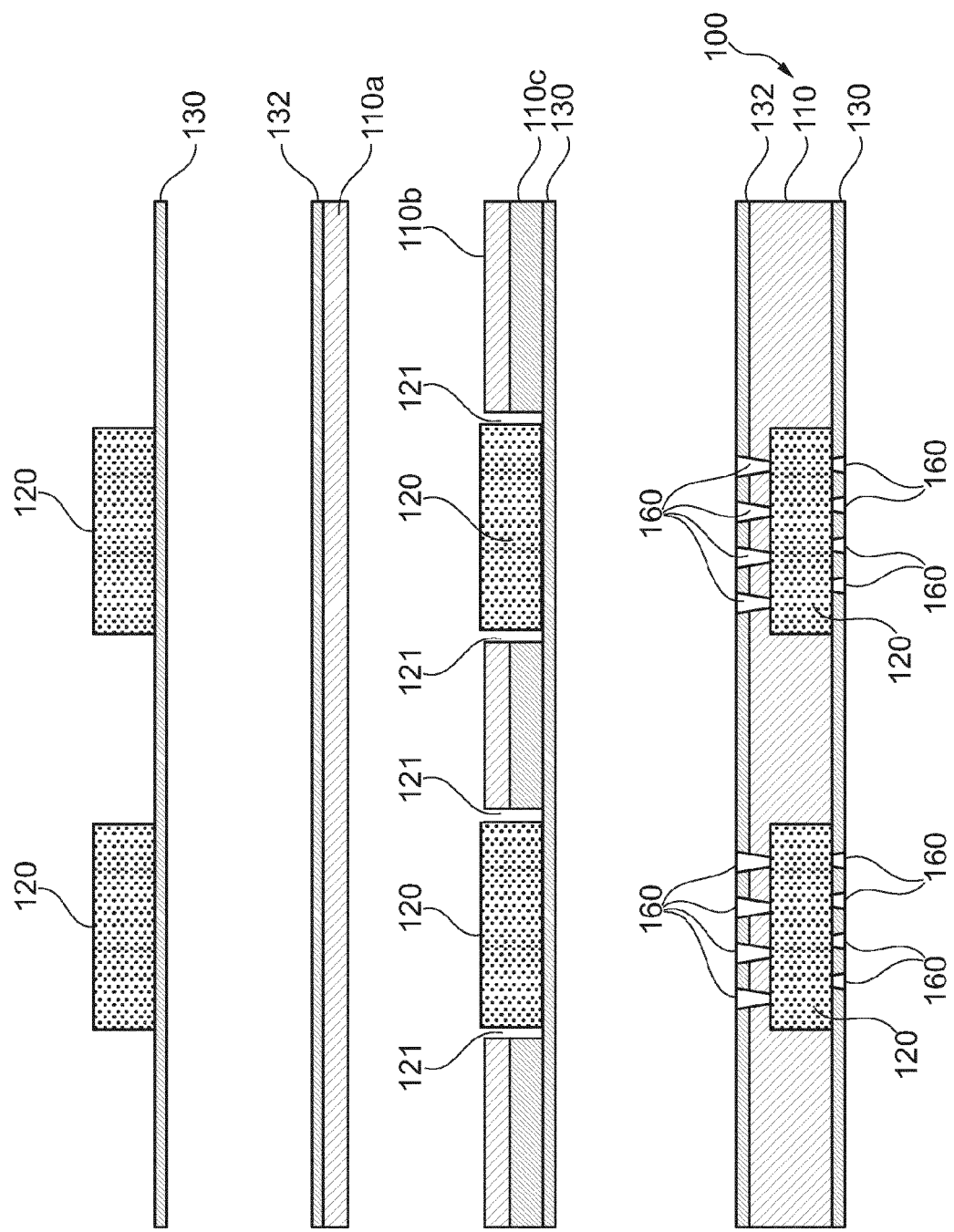
FIG. 1 shows in a cross-sectional view the manufacturing of a circuit board according to a first embodiment with two embedded electronic components which, at the beginning of the manufacturing, are only attached on a metal foil.

It should be noted that in the following detailed description, features and components, respectively, of different embodiments which are equal or at least functionally equal to the respective features and components, respectively, of another embodiment, are provided with the same reference signs or with a reference sign which only differs in the first digit from the reference sign of the equal or at least functionally equal features and components, respectively. In order to avoid unnecessary repetitions, features and components, respectively, which have been already described by means of a previously described embodiment, shall not be described again in detail later.

Further, it should be noted that the below described embodiments merely constitute a restricted selection of possible variants of the embodiments of the invention. In particular, it is possible to combine the features of the single embodiments in a suitable manner, such that with the variants of the embodiments which are explicitly shown here, a multiplicity of different embodiments are to be considered as obviously disclosed for those skilled in the art.

Moreover, it should be noted that spatially related terms, such as "front" and "back", "above" and "below", "left" and "right", etc. are used to describe the relationship of an element to another element or to other elements, as illustrated in the figures. Accordingly, the spatially related terms may apply for orientations which differ from the orientations which are shown in the figures. However, it is self-evident that all such spatially related terms, for the sake of simplicity of the description, relate to the orientations which are shown in the figures and are not necessarily limiting, since the respectively shown device, component etc., when in use, can assume orientations which differ from the orientations which are shown in the drawing.

FIG. 1 illustrates in a cross-sectional view by means of three steps the manufacturing of the circuit board 100 according to a first embodiment of the invention. As can be seen in the lower illustration of FIG. 1, two electronic components 120 which may be active components, passive components, and in particular an RFID component, are embedded in the circuit board. It should be noted that the circuit board 100 after its manufacturing can also be separated and singularized, respectively, into multiple single circuit boards, such that in each single circuit board only one electronic component 120 is embedded, for example.

In the upper illustration of FIG. 1 it is illustrated that, according to the embodiment which is shown here, the both electronic components 120 firstly are attached on a metallic layer 130. Since, according to the here illustrated embodiment, no carrier structure is used for the metallic layer 130, the metallic layer 130 is a metal foil. The metal foil 130 is consisting preferably of copper.

As can be seen in the central illustration of FIG. 1, on the metal foil 130 besides the electronic components 120, firstly a dielectric partial layer 110c is applied and subsequently a further dielectric partial layer 100b is applied on the dielectric partial layer 110c. According to the here illustrated embodiment, the upper surface of the further dielectric partial layer 100b is flush with the upper side of the electronic component 120. As can be further seen in FIG. 1, the both layers 110b and 110c do not completely reach to the sidewall of the electronic component 120, such that in the 2D sectional view, a gap 121 results which in reality, i.e. in 3D, is a spacing which is surrounding the electronic component 120.

At this point it should be noted that the electronic components 120 may be so-called bare dies and unhoused chips, respectively. Alternatively, the electronic components 120 may also be housed electronic components which on at least one of their outer sides comprise metallic contact structures and contact pads, respectively, which are not shown in FIG. 1.

As can be further seen in the central illustration of FIG. 1, according to the here illustrated embodiment, a cover structure is prepared. This cover structure, according to the here illustrated embodiment, contains a further dielectric partial layer 110a which is formed at the bottom side of a metallic layer 132 which is also formed as metal foil.

As can be seen in the lower illustration of FIG. 1, the cover structure which is consisting of the metal foil 132 and the dielectric partial layer 110a is put on the basic structure from above whose upper side is formed by the upper surface of the both electronic components 120 and by the upper surface of the dielectric partial layer 110b. Subsequently, the entire layer build-up is pressed in a known manner. Thereby, the three dielectric partial layers 110a, 110b, and 110c unite with each other to a uniform dielectric layer which is denoted with the reference sign 110 in FIG. 1. As a consequence of a certain flowability of the dielectric material, during pressing also the spacing 121 is filled.

After the procedure of pressing, in a known manner, for example by means of laser drilling, vias 160 may be formed. According to the here illustrated embodiment these vias 160 extend both from above and also from below up to the both electronic components 120. By means of a metallization of these vias 160, the electronic components 120 can be electrically contacted in a suitable manner later.

It should be noted that all dielectric partial layers 110a, 110b and 110c and the dielectric layer 110 which are used for the manufacturing of the circuit board 100 have the properties with respect to the elasticity (the elastic modulus E is in a range between 1 and 20 GPa) and the thermal expansion (the coefficient of thermal expansion CTE is in a range between 0 and 17 ppm/K) which are described above in this document. The same incidentally applies for the subsequently described circuit boards 200, 300, 400a, 400b and 400c.

Figure 2:
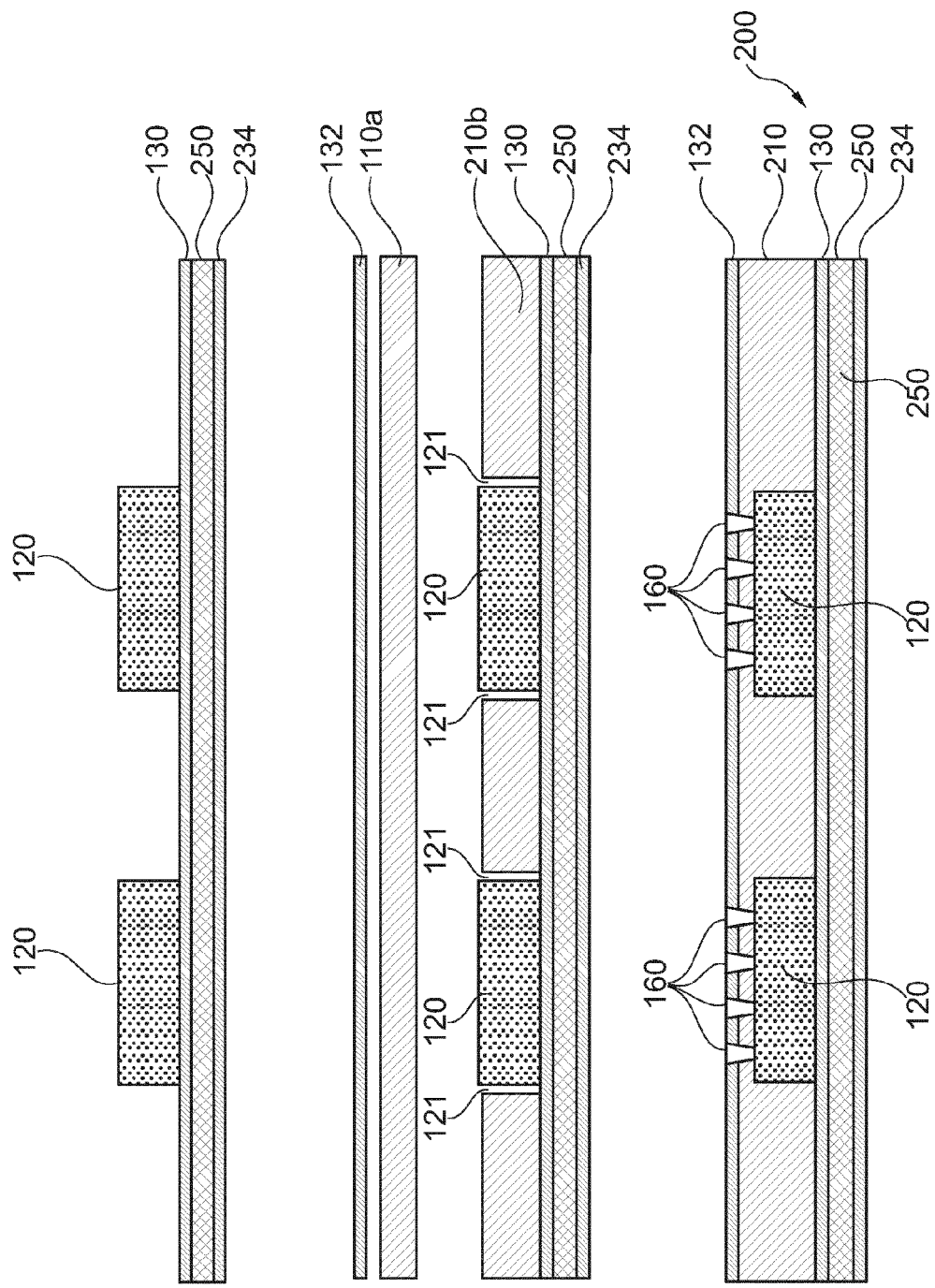
FIG. 2 shows in a cross-sectional view the manufacturing of a circuit board according to a second embodiment with two embedded electronic components which, at the beginning of the manufacturing, are attached on a sandwich structure which comprises a dielectric core-layer between two metallic layers.

FIG. 2 shows in a cross-sectional view the manufacturing of a circuit board 200 according to a second embodiment of the invention. Also the circuit board 200 comprises two embedded electronic components 120. In contrast to the circuit board 100 which is illustrated in FIG. 1, the both electronic components 120, as can be seen in the upper illustration of FIG. 2, are firstly applied on a sandwich structure. This sandwich structure, according to the here illustrated embodiment, contains a dielectric core-layer 250 which is located between two metallic layers and metal foils, respectively, 130 and 234. Compared to using only one metal foil 130, as it is shown in FIG. 1, the sandwich structure 130, 250, 234 constitutes a significantly more stable carrier structure for the both electronic components 120. This facilitates in an advantageous manner the handling of the carrier structure for the both electronic components.

The further method steps of manufacturing the circuit board 200 differ from the method steps of manufacturing the circuit board 100 only in two aspects which are not shown in FIG. 1. For this reason, these further method steps are not explained here in detail again and only the two differences compared to FIG. 1 are described.

It should be noted that at least one of the above described dielectric layers may also be a dielectric prepreg-layer which has the special mechanical and thermal properties which are described in this document and which constitutes a material composite made of glass fibers and resin. The same holds for the subsequently described embodiments as well.

As can be seen in the central illustration of FIG. 2, only one single dielectric partial layer 210b is located above the metallic layer 130 rather than two initially different dielectric partial layers 110b and 110c (cf. FIG. 1). In the lower illustration of FIG. 2, the both dielectric partial layers 110a and 110b (by means of a pressing procedure) have been connected to one uniform dielectric partial layer 210.

As can be seen in the lower illustration of FIG. 2, according to the here illustrated embodiment, the vias 160 are only formed from above and consequently extend to the electronic components 120 only from above. Thus, the electronic components 120 can only be electrically contacted at one side. However, this does not constitute a limitation for the most electronic components, since these comprise electrical terminal contacts at only one of their sides anyway.

Figure 3:
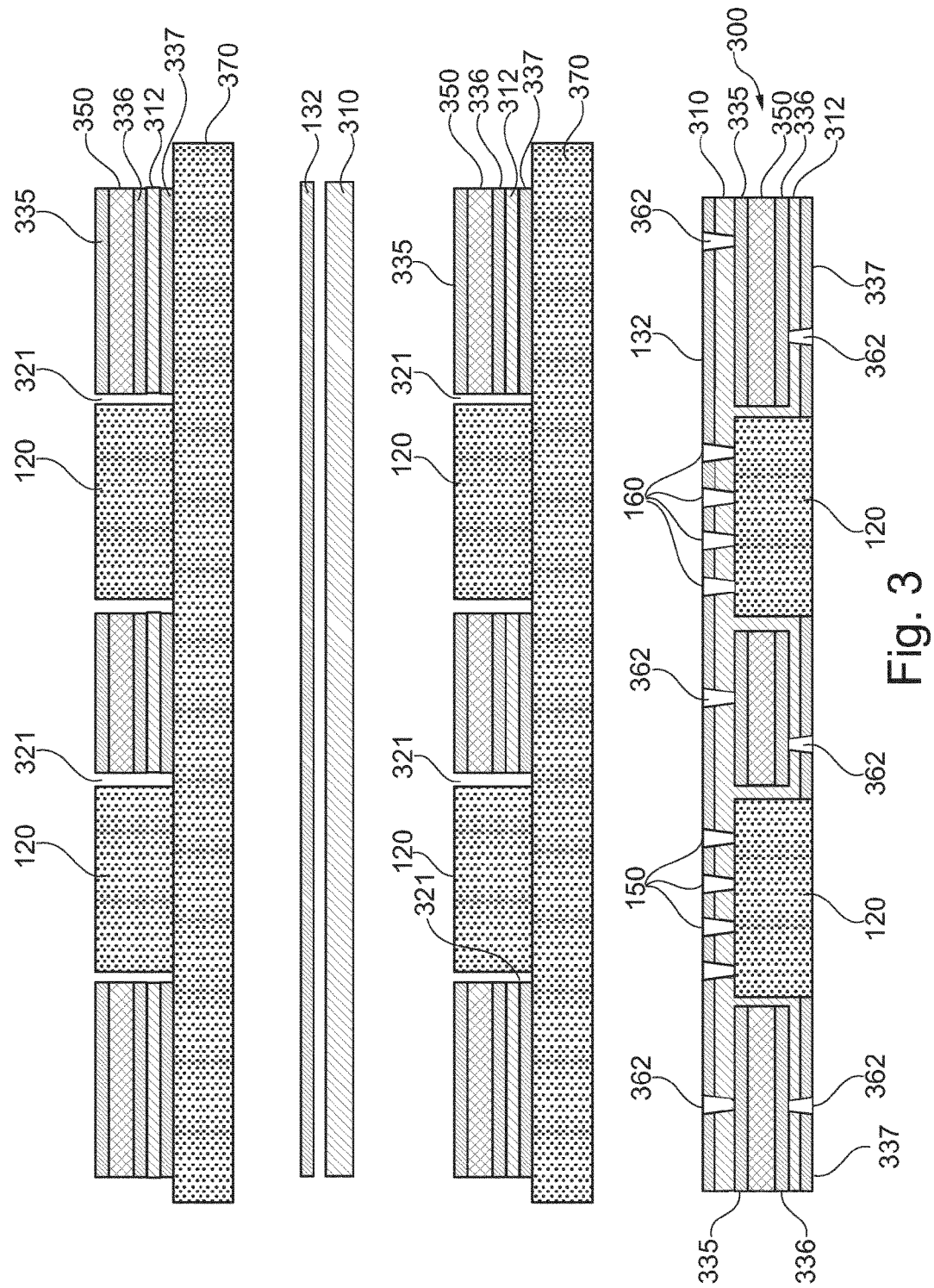
FIG. 3 shows in a cross-sectional view the manufacturing of a circuit board according to a third embodiment using a temporary carrier.

FIG. 3 shows in a cross-sectional view the manufacturing of the circuit board 300 according to a third embodiment of the invention. As can be seen in the upper illustration of FIG. 3, the both embedded electronic components 120 at first are attached on an upper side of the temporary carrier 370. According to the here illustrated embodiment, this temporary carrier 370 is an adhesive foil which is also often referred to as tape.

Further, (besides the electronic components 120) a layer sequence is attached on the temporary carrier 370, which, according to the here illustrated embodiment, is consisting of the following layers: (a) a metallic layer 337, (b) a dielectric layer 312, (c) a metallic layer 336, (d) a dielectric core-layer 350, and (e) a metallic layer 335.

According to the here illustrated embodiment, during forming the above-mentioned layer sequence, respectively between a sidewall of the electronic component 120 and the sidewall of the layer sequence which is facing the electronic component 120, a gap and a spacing 321, respectively, are left free. This gap and spacing 321, respectively, can already be left free during a successive applying of the concerning layers of the layer sequence. Alternatively, the gaps and spacings 321, respectively, can also be formed by a suitable ablation, for example by means of an etching procedure, after a complete forming of a layer sequence which extends up to the sidewall of the electronic component 120.

As can be seen in the central illustration of FIG. 3, further a cover structure is provided which, according to the here illustrated embodiment, contains a metal foil 132 and a further dielectric layer 310 which is formed at the bottom side of the metal foil 132.

After putting on the carrier structure, the resulting layer composite is pressed. This pressing may be performed in particular together with the temporary carrier 370. If the pressing is performed together with the temporary carrier 370, the temporary carrier 370 is removed from the pressed circuit board 300 after the procedure of pressing (cf. lower illustration of FIG. 3).

Also in this embodiment, during pressing, the spacings 321 are filled with the dielectric material which comprises a certain creeping capability, as described above. As a result, the concerning electronic component 120 thus is at least to a large extent completely surrounded by the dielectric material with its advantageous properties with respect to elasticity and thermal expansion.

As can be seen in the lower illustration of FIG. 3, not only the vias 160 are formed in the circuit board 330, which are known from the circuit board 200. Furthermore, according to the here illustrated embodiment, vias 362 are formed in the circuit board 300, which extend downwardly from above to the metallic layer 336 and upwardly from below to the metallic layer 337, respectively. By these vias 362, in a suitable manner after a suitable metallizing, the metallic layers 336 and 337, respectively, can be electrically contacted.

Figure 4:
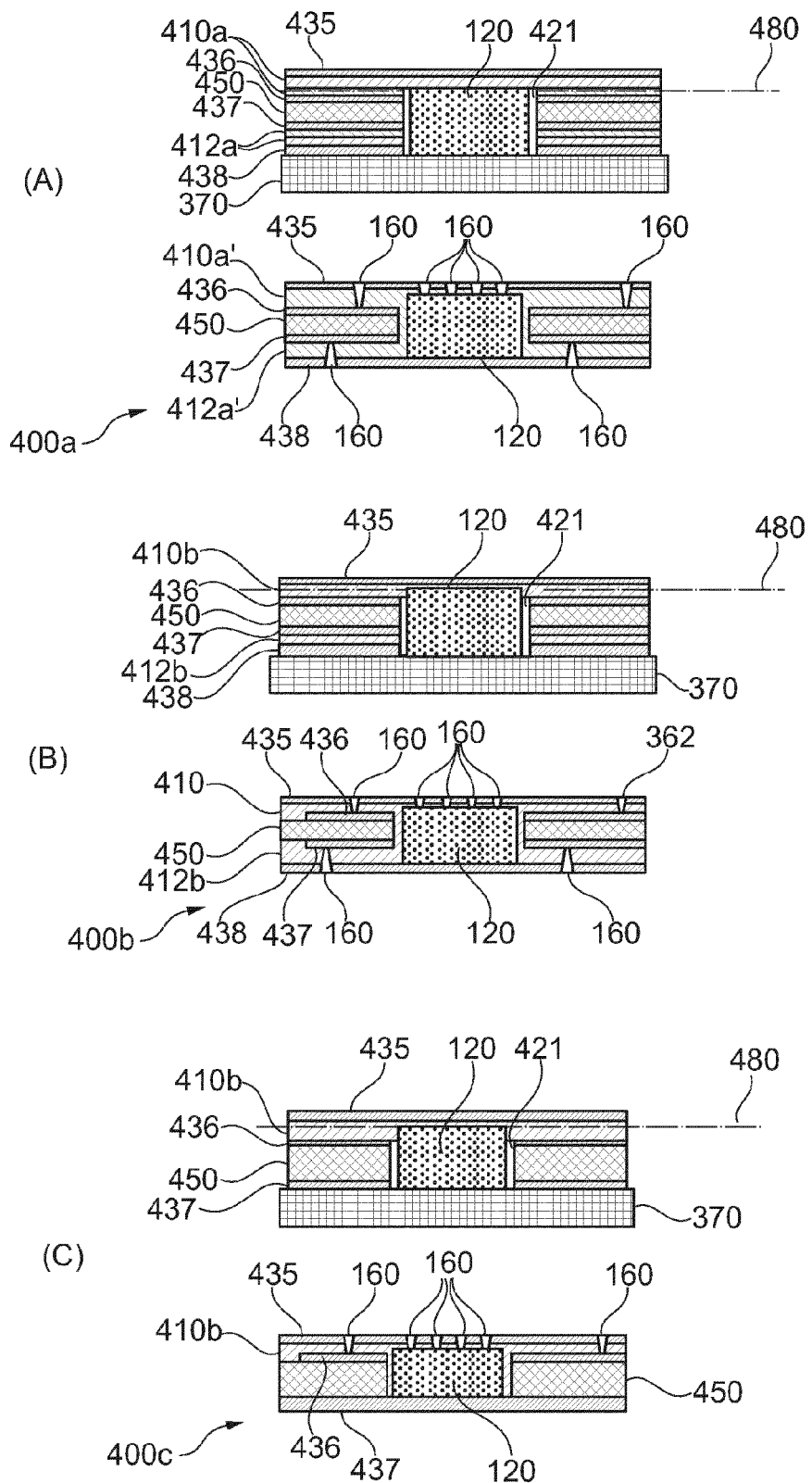
FIGS. 4a to 4c illustrate a reducing of the thickness of a circuit board which is manufactured with an embedded electronic component, using the dielectric material which is described in this document.

The FIGS. 4a to 4c illustrate different circuit boards 400a, 400b and 400c which have different thicknesses. According to the here illustrated embodiments, the circuit board 400a (without the temporary carrier 370) has a thickness of approximately 220 μm. This corresponds to the thickness of known circuit boards with embedded components. The circuit board 400b has a thickness of approximately 185 μm and the circuit board 400c has a thickness of approximately 170 μm. The thinnest circuit board 400c thus is circa 20% thinner than the circuit board 400a which, despite of using the dielectric material which is described in detail in this document, is not thinner than a comparable conventional circuit board. It should be noted that in reality the thicknesses of the circuit boards are dependent on the height of the embedded component. The above mentioned thicknesses relate to an embedded component with a height of 150 μm.

In the upper illustrations of the FIGS. 4a to 4c, the layer composite of the respective circuit board 400a, 400b and 400c is shown in an unpressed state together with the respective temporary carrier 370. In the lower illustrations of the FIGS. 4a to 4c, the completely pressed circuit board 400a, 400b and 400c are respectively illustrated without the corresponding temporary carrier.

As can be seen in FIG. 4a, above the temporary carrier 370, a layer structure is built up which, according to the here illustrated embodiment, from bottom to the top comprises the following layers: (a) a metallic layer 438, (b) two dielectric partial layers 412a, (c) a metallic layer 437, (d) a dielectric core-layer 450, (e) a metallic layer 436, (f) two dielectric partial layers 410a, and (g) a metallic layer 435.

According to the here illustrated embodiment, a cavity is formed within this layer structure, in which an electronic component 120 is located. This cavity was formed during building up the layer structure after forming the lower dielectric partial layer 410a. Only after inserting the electronic component 120, the remaining layers, that is the upper dielectric partial layer 410a and the metallic layer 435, have been formed.

As can be seen in FIG. 4a, the width of the cavity is slightly larger than the width of the electronic component 120. However, as can be seen in the lower illustration of FIG. 4a, the corresponding hollow 421 is filled during pressing the layer sequence due to a flowability of the dielectric material. Thereby, a connection results between (a) the dielectric layer 410a' which is generated by a pressure induced connecting of the both dielectric partial layers 410a, and (b) the dielectric layer 412a' which is generated by a pressure induced connecting of the both dielectric partial layers 412a. Thereby, the electronic component 120 is surrounded by the inventive dielectric material at different sides, such that an especially stress-free embedding of the electronic component 120 in the circuit board 400a results.

It should be noted that the height of the cavity which is shown in FIG. 4a may be larger than the thickness of the electronic component 120. This has the advantage that during pressing no or only very low pressure is acting upon the electronic component 120.

For the sake of completeness it should be mentioned that also in the circuit board 400a, suitable vias 160 and 362 may be formed which, after a metallization which is performed in a known manner, generate electrical connections which extend in the vertical direction. As can be seen in the lower illustration of FIG. 4a, the vias 160 serve for an electrical connection between the electronic component 120 and the metal layer 435. By means of the vias 362, the both inner metallic layers 436 and 437 can be electrically conductively connected with the respectively adjacent outer metallic layer 435 and 438, respectively.

In FIG. 4b the manufacturing of a circuit board 400b is illustrated which differs from the manufacturing of the circuit board 400a in that instead of the dielectric partial layers 410a and 412a, a uniform dielectric layer 410b and 412b, respectively, is used from the beginning on. The circuit board 400b further differs from the circuit board 400a in that the electronic component 120 has already been pressed into the upper dielectric layer 410b previous to the procedure of pressing the layer composite. This difference in the height between the hollow 421 and the electronic component 120 is in a range between circa 5 μm and 15 μm. Such a pressing-in the electronic component 120 is only possible without a destruction of the same, since the material of the upper dielectric layer 410b has the excellent properties with respect to the elastic modulus E and the coefficient of thermal expansion which have been described in this document. When using a conventional dielectric (prepreg-) material, such a pressing-in would lead to a destruction of the electronic component 120. In this context, from a process-technological point of view, it is also important that the used dielectric material comprises the deformability which has been described in this document also at temperatures of below 100° C. and in particular even still at room temperature. Also in FIG. 4b, the entering of the dielectric material into the hollow 421 within the cavity can be seen, in which the electronic component 120 is located.

In FIG. 4c, the manufacturing of the circuit board 400c is illustrated which differs from the manufacturing of the circuit board 400b in that the lower dielectric layer 412b and the upper metallic layer 438 are not used. It should be noted that omitting the metallic layer 438 and in particular omitting the dielectric layer 412b is only possible, since the dielectric material of the remaining dielectric layer 410b comprises the excellent properties with respect to its elasticity and with respect to its thermal expansion which are described in this document. Furthermore, in the circuit board 400c, the cavity for the electronic component 120 is formed in a structured core which is consisting of the layers 437, 450 and 436. As can be seen in the upper illustration of FIG. 4C, the electronic component 120 is higher than the core and the cavity, respectively. During pressing, the dielectric layer 410b provides the material which enters into the hollow 421 and surrounds the electronic component 120 in a mechanically gentle manner.

The reduction of the build-up thickness is illustrated in the FIGS. 4a to 4c respectively by a "dash-dot-line" 480 which specifies the top side of the electronic component 120. By means of this "dash-dot-line" 480, the height of the layer build-up above the electronic component 120 can be clearly recognized. In this context it should be noted again that the reducing of the thickness of a circuit board 400c which is manufactured with an embedded electronic component 120, which is illustrated in the FIGS. 4a to 4c, in praxis is only possible with the dielectric material which is described in this document, since other dielectric materials would lead to circuit boards which could in no way fulfill the quality requirements with respect to their mechanical and thermal stability which are very high today.

The FIGS. 5a, 5b and 5c illustrate the separating of a symmetric circuit board structure 505 into two asymmetric circuit boards 500a and 500b. As can be seen in FIG. 5a, according to the here illustrated embodiment, the substantially symmetric circuit board structure 505 from top to bottom comprises the following layer composite:
- a metallic layer 530,
- a dielectric layer 510,
- a metallic layer 532,
- a dielectric core-layer 550,
- a metallic layer 534,
- a dielectric layer 512 and a release layer 590 which, respectively in different planar subregions within an xy-plane which is perpendicular with respect to a vertical z-axis, form a common layer in the illustrated layer composite,
- a metallic layer 536,
- a dielectric core-layer 552,
- a metallic layer 538,
- a dielectric layer 514,
- a metallic layer 539.

At this point it should be noted that all asymmetric build-ups which are described above by means of FIG. 1 can be used for the here described symmetric manufacturing method.

As can be seen in FIG. 5a, above the release layer 590, two electronic components 520a and 520b are embedded. The respective electronic component 520a, 520b is completely embedded in the dielectric layer 510 with its advantageous mechanical and thermal properties from above and from the side. At the bottom side of the both electronic components 520a and 520b the release layer 590 is abutting.

In a corresponding manner, below the release layer 590 two electronic components 520c and 520d are embedded. These are completely surrounded by the dielectric layer 514 at their bottom sides and at their lateral surfaces. At the top side of the both electronic components 520c and 520d the release layer 590 is abutting.

Furthermore, as can be also seen in FIG. 5a, a multiplicity of vias 560 for respectively a suitable electrical contacting are formed.

The FIGS. 5b and 5c show the two asymmetric circuit boards 500a and 500b which are generated by a separating of the layer composite 505 at the release layer and at the, with respect to the plane, comparably small subregions of the dielectric layer 512. The portions of the release layer which are generated after the separating are denoted with the reference signs 590a and 590b, respectively, in the FIGS. 5B and 5C.

Figure 5:
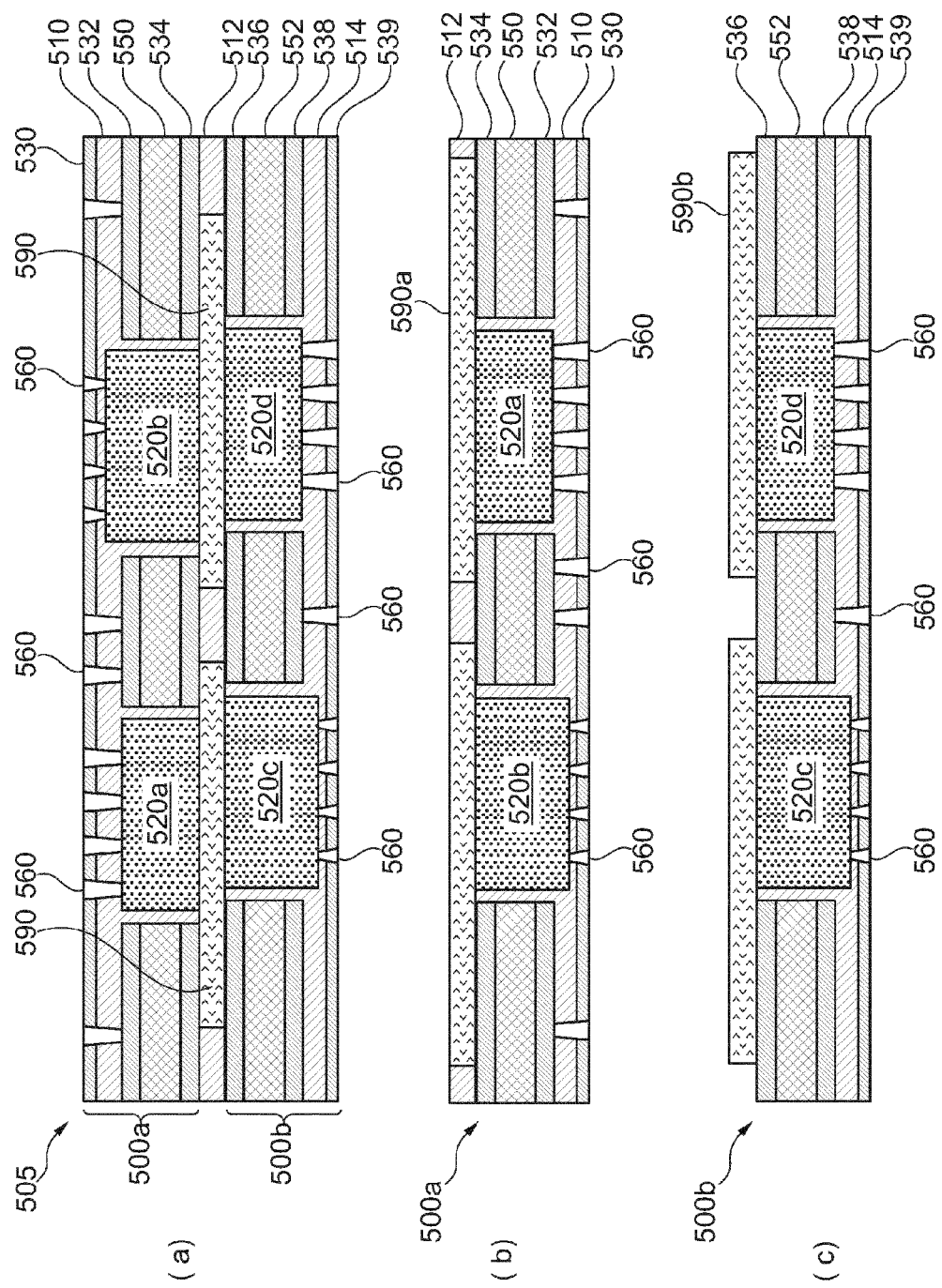
FIGS. 5a, 5b and 5c illustrate the manufacturing of a symmetric circuit board structure with two semi-finished products which respectively are an asymmetric circuit board.

The advantage of the here described manufacturing of two asymmetric circuit boards 500a and 500b can be seen in that many processing steps which are not shown in FIG. 5 can be performed at the substantially symmetric layer composite 505.

Finally, it should be noted that, as already described in the chapter summary of the invention, instead of electronic components, also mechanical or thermally conductive components may be implemented in the circuit board.

REFERENCE SIGNS 100 circuit board with embedded electronic components
110 dielectric layer
110a,b,c dielectric partial layer
120 electronic component
121 gap/spacing
130 metallic layer/metal foil
132 metallic layer/metal foil
160 vias
200 circuit board with embedded electronic components
210 dielectric layer
210b dielectric partial layer
250 dielectric core-layer
234 metallic layer/metal foil
300 circuit board with embedded electronic components
310 dielectric layer
312 dielectric layer
321 gap/spacing
335 metallic layer
336 metallic layer
337 metallic layer
350 dielectric core-layer
362 vias
370 temporary carrier/tape
400a,b,c circuit board with embedded electronic component
410a dielectric partial layers
410a' united dielectric layer
410b dielectric layer
412a dielectric partial layers
412a' united dielectric layer
412b dielectric layer
421 hollow
435 metallic layer
436 metallic layer
437 metallic layer
438 metallic layer
450 dielectric core-layer
480 dash-dot-line
500a circuit board (asymmetric)
500b circuit board (asymmetric)
505 circuit board structure (symmetric layer build-up)
510 dielectric layer
512 dielectric layer
514 dielectric layer
530 metallic layer
532 metallic layer
534 metallic layer
536 metallic layer
538 metallic layer
539 metallic layer
550 dielectric core-layer
552 dielectric core-layer
560 vias
590 release layer
590a/b portion of release layer

The invention claimed is:

1. A circuit board, comprising:
a dielectric layer which comprises a planar extension in parallel with respect to an xy-plane which is spanned by an x-axis and a y-axis perpendicular thereto, and a layer thickness along a z-direction which is perpendicular with respect to the x-axis and to the y-axis;

a metallic layer which is attached to the dielectric layer in a planar manner; and a component which is embedded in the dielectric layer and/or in a dielectric core-layer of the circuit board;

wherein the dielectric layer comprises a dielectric material which has an elastic modulus E in a range between 1 and 20 GPa and a coefficient of thermal expansion in a range between 0 and 17 ppm/K along the x-axis and along the y-axis;

wherein the dielectric material is a blend or a copolymer consisting of at least one first material with a first elastic modulus E and a first coefficient of thermal expansion and a second material with a second elastic modulus E and a second coefficient of thermal expansion;

wherein the first elastic modulus is larger than the second elastic modulus;

wherein the first coefficient of thermal expansion is smaller than the second coefficient of thermal expansion; and wherein the second material comprises a thermally curable resin which is connected with a softening substance.

2. The circuit board of claim 1, further comprising at least one of the following features:

wherein the first material comprises a first glass transition temperature and the second material comprises a second glass transition temperature, wherein the first glass transition temperature is larger than the second glass transition temperature, wherein the first material comprises a resin and a hard filler which is contained therein.

3. The circuit board of claim 1,
wherein the value for the elastic modulus E is in a range between 2 and 7 GPa.

4. The circuit board of claim 1,
wherein the coefficient of thermal expansion is in a range between 3 and 10 ppm/K.

5. The circuit board of claim 1, further comprising:
wherein the dielectric core-layer is attached to the metallic layer and/or to the dielectric layer in a planar manner;
wherein the component is embedded in the dielectric core-layer and the dielectric layer is arranged above or below the dielectric core-layer and the embedded component.

6. The circuit board of claim 1,
wherein the component is embedded in the dielectric layer.

7. The circuit board of claim 1, further comprising at least one of the following features:
wherein the dielectric layer is a dielectric prepreg-layer and/or the dielectric material is a dielectric prepreg-material,
wherein the entire thickness of the layer composite is smaller than approximately 200 µm.

8. The circuit board of claim 1, which further comprises an asymmetric build-up with respect to a plane of the embedded component along an axis, wherein
the plane is oriented in parallel with respect to the planar surface of the dielectric layer,
the plane intersects the embedded component in the center, and
the axis is perpendicular with respect to this plane.

9. The circuit board of claim 5,
wherein the component is adhered in the dielectric core-layer.

10. The circuit board of claim 5,
wherein the dielectric core-layer comprises a dielectric core-material which has a coefficient of thermal expansion of 0 to 11 ppm/K along the x-axis and along the y-axis.

11. A method of manufacturing a circuit board, the method, comprising:
providing a dielectric layer which comprises a planar extension in parallel with respect to an xy-plane which is spanned by an x-axis and a y-axis perpendicular thereto, and comprises a layer thickness along a z-direction which is perpendicular with respect to the x-axis and to the y-axis; and
embedding a component in the dielectric layer and/or in a dielectric core-layer of the circuit board, wherein the dielectric core-layer is attached to the dielectric layer;
wherein the dielectric layer comprises a dielectric material which has an elastic modulus E in a range between 1 and 20 GPa and has a coefficient of thermal expansion in a range between 0 and 17 ppm/K along the x-axis and along the y-axis;
wherein the dielectric material is a blend or a copolymer consisting of at least one first material with a first elastic modulus E and a first coefficient of thermal expansion and a second material with a second elastic modulus E and a second coefficient of thermal expansion;
wherein the first elastic modulus is larger than the second elastic modulus;
wherein the first coefficient of thermal expansion is smaller than the second coefficient of thermal expansion; and
wherein the second material comprises a thermally curable resin which is connected with a softening substance.

12. The method of claim 11, further comprising:
forming a recess in the dielectric layer and/or in the dielectric core-layer;
wherein embedding the component comprises:
inserting the component in the recess.

13. The method of claim 11, further comprising at least one of the following features:
wherein embedding the component further comprises:
inserting an adhesive material in the recess;
wherein the recess is larger than the component, such that after an inserting of the component in the recess, a hollow remains.

14. The method of claim 11, further comprising:
if the component is embedded in the dielectric layer,
applying a further dielectric layer on the dielectric layer and the component, wherein the further dielectric layer has the same properties as the dielectric layer; and
if the component is embedded in the dielectric core-layer,
applying the dielectric layer on the dielectric core-layer and the component.

15. The method of claim 11, further comprising at least one of:
forming a metallic layer at the dielectric layer,
pressing all layers of the circuit board.

16. A method of manufacturing two processed circuit boards, the method, comprising:

building up a layer composite comprising
- a first circuit board,
- a second circuit board, and
- a release layer which is arranged between the first circuit board and the second circuit board;

wherein the first and second circuit boards are arranged with a dielectric layer which includes
- a planar extension in parallel with respect to an xy-plane which is spanned by an x-axis and a y-axis perpendicular thereto,
- a layer thickness along a z-direction which is perpendicular with respect to the x-axis and to the y-axis;
- a metallic layer which is attached to the dielectric layer in a planar manner; and
- a component which is embedded in the dielectric layer and/or in a dielectric core-layer of the circuit board;

wherein the dielectric layer comprises a dielectric material which has an elastic modulus E in a range between 1 and 20 GPa and a coefficient of thermal expansion in a range between 0 and 17 ppm/K along the x-axis and along the y-axis; and wherein the dielectric material is a blend or a copolymer consisting of at least one first material with a first elastic modulus E and a first coefficient of thermal expansion and a second material with a second elastic modulus E and a second coefficient of thermal expansion;

wherein the first elastic modulus is larger than the second elastic modulus;

wherein the first coefficient of thermal expansion is smaller than the second coefficient of thermal expansion;

wherein the second material comprises a thermally curable resin which is connected with a softening substance;

wherein the dielectric layer is a dielectric prepreg-layer and/or the dielectric material is a dielectric prepreg-material;

wherein the entire thickness of the layer composite is smaller than approximately 200 µm;

processing the entire layer composite; and separating the layer composite at the release layer, such that a first processed circuit board and a second processed circuit board with respectively one asymmetric layer composite are generated.

17. The method of claim 16, further comprising at least one of the following features:
- wherein the built up layer composite comprises a symmetry plane along the z-axis, which is oriented in parallel with respect to the xy-plane,
- wherein the release layer comprises a printable adhesion reducing material and wherein the method further comprises
- printing the adhesion reducing material on at least a subregion of the first circuit board or on at least a subregion of the second circuit board.

* * * * *